LOW CAPACITANCE SEMICONDUCTOR DEVICES

Filed April 3, 1961

JOHN H. THOMAS,
WAYNE H. SCHNEPPLE,
INVENTORS.

BY THEIR ATTORNEYS.

Spensley & Horn.

3,200,311

LOW CAPACITANCE SEMICONDUCTOR DEVICES

John H. Thomas, Canoga Park, and Wayne F. Schnepple, Los Angeles, Calif., assignors to Pacific Semiconductors, Inc., Lawndale, Calif., a corporation of Delaware Filed Apr. 3, 1961, Ser. No. 100,427
7 Claims. (Cl. 317—234)

This invention pertains to semiconductor devices and more particularly to methods for producing low capacitance semiconductor junction devices.

In junction semiconductor devices rectifying junctions or barriers are produced by establishing contiguous regions of opposite conductivity types in the semiconductor material. A region of semiconductor material containing an excess of donor impurities and yielding an excess of free electrons is considered to be an impurity-doped N type region. An impurity-doped P type region is one containing an excess of acceptor impurities resulting in a deficit of electrons, or an excess of holes. Stated differently, an N type region is one characterized by electron conductivity, whereas a P type region is one characterized by hole conductivity. A normally doped region is one having the minimum concentration of active impurity required to determine the conductivity type. A heavily doped region of N type conductivity is commonly referred to as an $N^+$ region, the + indicating that the concentration of the active impurity in the region is greater than the minimum required to determine the conductivity type. Similarly, a $P^+$ type region indicates a heavily doped region of P type conductivity.

When a continuous, solid crystal specimen of semiconductor material has a region of one conductivity type contiguous with a region of the opposite conductivity type, the boundary between the two regions is termed a junction. The boundary between a P type region and an N type region is specifically termed a PN junction. A semiconductor diode has one junction, while a transistor has at least two junctions. The present invention is applicable to both semiconductor diodes and transistors.

The high frequency response of a semiconductor device is limited by its junction capacitance. Various methods have been devised to reduce the junction capacitance in order to extend the high frequency response. One prior art method of producing low capacitance junctions involves the use of aluminum alloys, while others involve various mesa etching techniques on diffused wafers to reduce the junction area. However, these prior art methods are themselves limited by the necessity of maintaining a sufficiently large junction area to enable attachment of an electrical lead to the device. This limitation has become increasingly important with the advent of miniaturized semiconductor devices.

As the art of miniaturization has developed in the semiconductor industry, it has been found necessary to reduce still further in size glass-to-metal packages housing the semiconductor bodies. Inasmuch as the active crystal element of a semiconductor diode, for example, amounts to but a very small fraction of the total volume of the completed package, it is clear that to achieve optimum miniaturization the volume of the package must approach that of the crystal. In addition to decreasing the size, recently developed uses for semiconductor devices have made necessary greatly increased reliability in the freedom of devices from mechanical or electrical failure when subjected to abusive use and greatly varying environmental conditions.

The prior art semiconductor devices are typically housed in packages which involve a glass-to-metal seal requiring close manufacturing tolerances. Whisker contact is generally made to one surface of the crystal, resulting in a structure which is inherently sensitive to shock and vibration. Furthermore, the power dissipating capacity of such a device is limited due to the small cross-sectional area and current carrying capacity of the whisker element.

However, there has been reecntly developed an improved miniaturized semiconductor device having ribbon-shaped lead wires of a width substantially equal to the width of the crystal element and directly bonded to substantially the entire surface thereof to thereby provide a micro-miniature structure capable of relatively high power dissipation. The aforementioned micro-miniature device is fully disclosed in U.S. patent application Serial No. 847,355, filed October 19, 1959, now Patent No. 3,002,133, entitled, "Micro-Miniature Semiconductor Devices," by Clinton E. Maiden and Elmo E. Maiden, and also assigned to the assignee of the present invention. The method of the present invention is directed toward decreasing the junction capacitance of such micro-miniature devices.

Accordingly, it is an object of the present invention to provide methods for fabricating semiconductor devices with low junction capacitance.

It is also an object of the present invention to provide methods for fabricating low capacitance diffusd junction semiconductor devices.

It is a further object of the present invention to provide methods for extending the high frequency response of miniature semiconductor devices.

It is a still further object of the present invention to provide methods for reducing the junction capacitance of miniature semiconductor devices.

It is another object of the present invention to provide a method for fabricating an improved micro-miniature semiconductor diode having an extremely low junction capacitance.

It is also an object of the present invention to provide a method for reducing the capacitance of a junction between semiconductor regions of differing active impurity concentrations.

It is a yet further object of the present invention to provide a method for reducing the capacitance of a boundary between semiconductor regions of the same conductivity type but of differing active impurity concentrations.

The preferred embodiment of the present invention consists essentially of heavily doping a surface region of a normally doped portion of a semiconductor body with an active impurity of the opposite conductivity type to thereby create a junction separating highly doped and normally doped regions, ohmically bonding an electrical contact element to substantially the entire surface of the heavily doped region, and then preferentially etching away a predetermined portion of the heavily doped material to reduce the cross-sectional area of the junction to a size substantially smaller than the remaining contact area.

The present invention may be particularly advantageously applied in the production of low capacitance diffused junction devices, although it may also be used in connection with the production of shallow alloy junction semiconductor devices. The method of the present invention, in addition to being useful during the fabrication of semiconductor devices, is also applicable in the modification of completed semiconductor devices having an electrical contact element bonded in ohmic contact with a highly doped semiconductor region.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figures 1, 2, 3, 4, 5, 6:
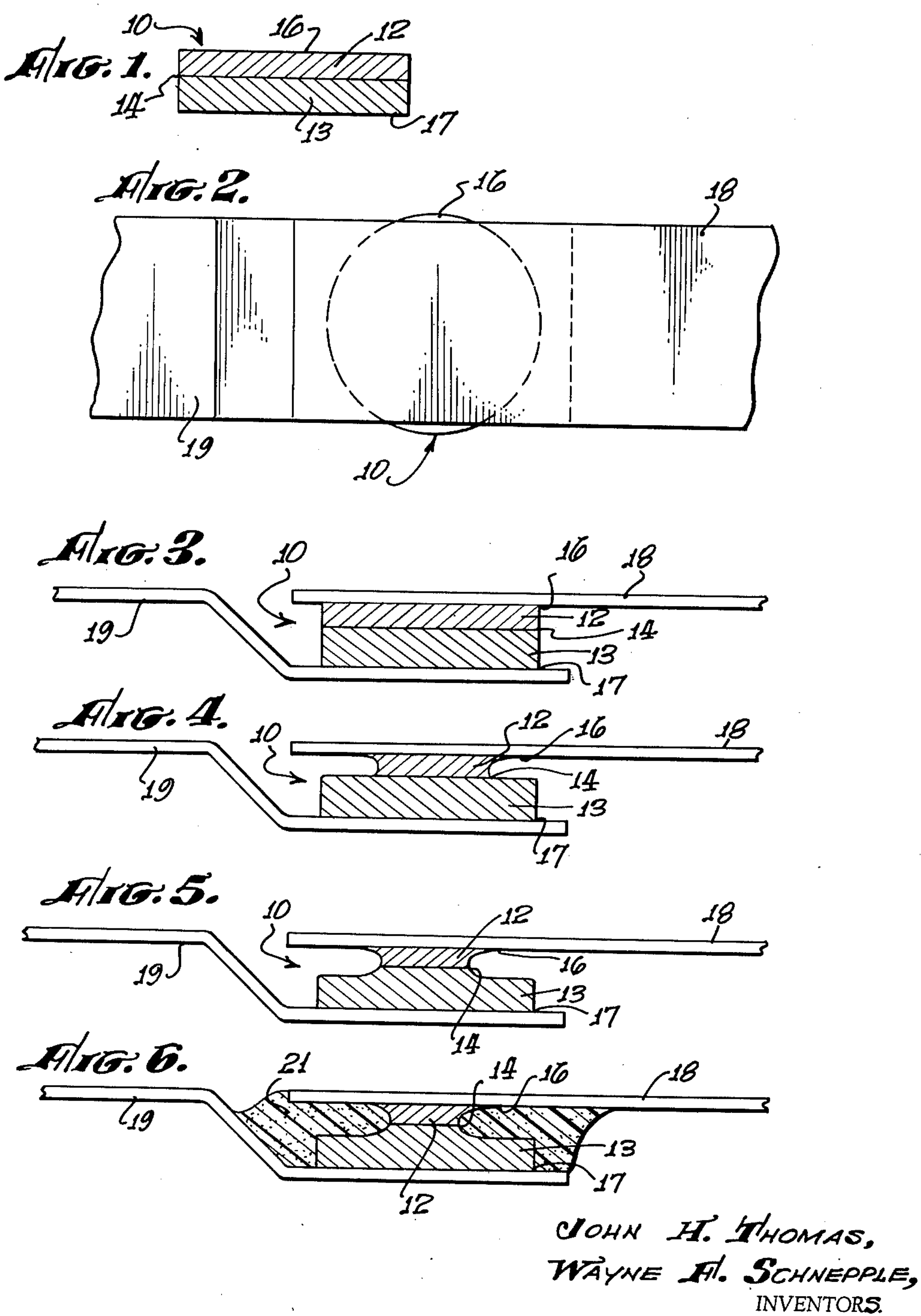
FIGURE 1 is a sectional view of a silicon crystal wafer in early stage of production of a miniature semiconductor diode.
FIGURE 2 is a plan view of the crystal wafer of FIGURE 1 to which electrical leads have been bonded.
FIGURE 3 is a sectional view of the device of FIGURE 2.
FIGURE 4 is a sectional view of the devices of FIGURES 2 and 3 at a subsequent production stage upon preferential removal of a predetermined portion of the crystal body.
FIGURE 5 is a sectional view of the device of FIGURE 4 at a later stage of production upon further removal of portions of the crystal body.
FIGURE 6 is a sectional view of a completed low capacitance semiconductor diode device fabricated in accordance with the method of the present invention.

Referring now to the drawing the method of the present invention will be described with respect to the fabrication of a miniature semiconductor diode of the type described in the hereinabove referenced patent application. In FIGURE 1 of the drawing there is shown a disc-shaped semiconductor crystal body 10 which in the illustrated embodiment is formed of silicon. The crystal body 10 includes a heavily doped P type conductivity region 12 and an N type conductivity region 13 separated by a PN junction 14. The PN junction may be produced by any method known to the art such as by alloying or diffusion techniques, for example. In the illustrated embodiment the PN junction is of the graded type formed by the well known diffusion techniques of heavily doping a region of an N type semiconductor crystal with a P type impurity. The upper surface 16 of the wafer 10 presents a substantially planar contacting surface of heavily doped P type conductivity, while the lower surface 17 of the wafer presents a substantially planar contacting surface of N type conductivity.

In FIGURES 2 and 3 electrical leads 18 and 19 are shown ohmically bonded to opposite surfaces of the crystal 10. The electrical lead 18 is bonded to the planar contact surface 16 of the $P^+$ region 12. The electrical lead 19 is bonded to the planar contact surface 17 of the N region 13. In its presently preferred form the leads 18 and 19 are ribbon-shaped throughout; that is, the cross-sectional configuration of leads 18 and 19 is rectangular. The width of the leads is approximately equal to the diameter of the crystal wafer 10. The leads are affixed to opposing surfaces of the crystal 10 such that each lead is in contact with substantially the entire planar surface of the crystal.

In the presently preferred embodiment, the ribbon-shaped leads are formed from a metal having proper physical and electrical properties such as nickle, molybdenum, or Kovar. In one exemplary embodiment nickle is used. The nickel leads are plated with a predeposited coating of gold throughout the entire surfaces thereof, since the gold plating makes possible a better low resistance contact between the leads and the surfaces of the crystal 10, and since gold is resistant to the etchants used in the present method. The ohmic bonding of the leads 18 and 19 to the crystal 10 can be accomplished by methods well known to the art. One such method, when the leads are coated with gold, is to form the bond between the crystal and the leads by placing the crystal and leads under pressure in a furnace and heating to a temperature sufficient to cause alloying between the silicon and the gold to thereby produce a silicon-gold eutectic or an alloy region. Temperatures of approximately 450° C. may be suitably employed at pressures of 800 to 1,000 p.s.i. between the leads and the crystal to cause bonding of the leads to the crystal surfaces. In addition, it has been found advantageous to slightly dope the gold coating which is deposited upon the nickel leads with an active impurity of the same type as that of the semiconductor crystal region with which the metal lead is to make contact. Thus, the lead 18 which is to be ohmically bonded to a heavily doped P type conductivity region is doped with a P type conductivity impurity in the gold layer to facilitate a good ohmic contact upon bonding. Such a dopant might be boron, for example. The other lead 19 is doped with an N type conductivity impurity such as arsenic, for example.

As shown in FIGURES 2 and 3 the leads 18 and 19 extending in opposite directions from the crystal 10 are preferably formed in coplanar alignment by bending of the lead 19 upward until the extending portion of the lead lies substantially in the same plane as the upper lead 18. Thus the leads extending from the crystal lie substantially in the same plane and along the common longitudinal center line of the device.

It is at this point in the manufacture of the illustrated semiconductor device that the novel etching steps of the present invention are incorporated into the fabrication process to greatly reduce the cross-sectional area of the PN junction 14. To reduce the cross-sectional area of the junction 14 the assemblage consisting of the crystal 10 and the bonded electrical leads 18 and 19 is immersed in a first etching solution which preferentially etches the heavily doped P type region while having little effect upon the N type silicon and the gold plated metallic lead elements.

The presently preferred first etching solution consists of 90% by volume of concentrated hydrofluoric acid (about 78% concentration in water) and 10% by volume of concentrated nitric acid (about 90% concentration in water). Solution concentrations ranging from 50% to 95% hydrofluoric acid have been found suitable, with a decrease in the preferential etching action as the nitric acid content increases. Also, various diluents or moderators, such as acetic acid, have been found to retard the etching rate without destroying the preferential action of the etching solution. It has also been found that the use of stainless steel containers for the preferred etching solution inhibits the preferential etching action; hence, platinum of Teflon containers are recommended. Upon completion of this preferential etching step the semiconductor device will appear as shown in FIGURE 4. The above described preferred etching solution is also satisfactory for use in etching $N^+$ regions of semiconductor materials, the etchant being preferential as to active impurity concentrations.

Use of the aforementioned presently preferred first etching solution results in staining of the semiconductor surface. Hence, the semiconductor device is subjected to a second etching solution, the second solution providing a cleansing etch. The cleansing etch solution removes foreign matter, stains and contaminants from the surface of the crystal body, and attacks both highly doped and normally doped silicon. The presently preferred cleansing etch consists of two parts by volume of hydrofluoric acid (about 40% concentration in water) and one part of nitric acid (about 90% concentration in water). Upon completion of the second etching step, wherein the stain is removed and the semiconductor surface cleansed, the device will appear as shown in FIGURE 5.

The combined etching times of the first and second etching steps determines the final diameter of the PN junction 14. In the illustrated embodiment the starting crystal 10, as shown in FIGURE 1, is typically 0.020 inch in diameter and 0.006 inch thick. The ribbon leads 18 and 19 are 0.0035 inch thick x 0.19 inch wide x 0.625 inch long. Hence the PN junction 14 is circular in shape with an original diameter of 0.020 inch. It has been found feasible to etch away a sufficient portion of the silicon body to result in a circular PN junction 14 having a diameter of about 0.003 inch to 0.004 inch. To achieve this diameter with the above indicated preferred etching solution the etching time of the first etching step (the preferential etch) should be about 20 seconds and the etching time of the second etching step (the cleansing etch) should be about 10 seconds.

Upon completion of the second etching step, the semiconductor device is then surface treated by immediate immersion in a quench solution comprised primarily of an organic liquid which has in its chemical structure a reactive hydroxyl group, broadly designated as $R(OH)_x$, and more specifically, a monohydric aliphatic alcohol containing from one to four carbon atoms per molecule. A 95% ethanol solution is presently preferred. It is necessary to transfer the assemblage from the cleansing etch solution to the quench solution without exposure of the assemblage to the ambient. It is believed that hydrofluorsilicic acid ($H_2SiF_6$) formed at the silicon surface when the crystal body is immersed in the quench solution will react with the hydroxyl radical at the silicon surface to form ester groups which are molecularly bonded to the silicon as a thin esterified protective film upon the silicon surface. The film is less than one micron, and normally on the order of 100 to 1000 Angstrom units, in thickness. Quenching times ranging from about 5 seconds to 5 minutes may be employed.

Upon attaining the configuration shown in FIGURE 5 and formation of the thin protective esterified film, an encapsulating material is applied to the device to afford physical strength and long term protection from the ambient. Suitable encapsulating materials include epoxy, resins, polysiloxanes, glass, ceramics or similar material which will provide added strength for the device. One such material which has been found particularly advantageous is heat stable, modified silicone, electrical insulating dipping and impregnating varnish such as that manufactured under the trademark "Sylkyd 1400" by the Dow-Corning Corp. To encapsulate the device with modified silicone varnish, for example, the device is heated by infra-red lamps at approximately 100° C. to evaporate any alcohol remaining from the quench. The crystal body is then coated with the sylkyd 1400 varnish by painting the device with a glass tipped rod. The modified silicone varnish is cured by drying the coated device at approximately 75° C. for 16 to 24 hours. A final cure is then effected by heating at approximately 175° C. for 200 hours or 200° C. for 24 hours. Upon encapsulation, the device will appear as shown in FIGURE 6, the encapsulating material being designated by the reference numeral 21.

Thus, there has been described a novel method for producing a low junction capacitance semiconductor device, resulting in a device structure wherein the cross-sectional area of the semiconductor junction is substantially smaller than the acual contact area of a lead element bonded in ohmic contact with the semiconductor body. Although the invention has been described with a certain degree of particularly, it is understood that the present disclosure has been made only by way of example and that numerous changes in the details of construction and the combination and arrangement of parts may be restored to without departing from the spirit and the scope of the invention as hereinafter claimed. For example, although the illustrated embodiment pertains to the reduction of junction capacitance of a micro-miniature semiconductor diode the novel fabricational steps disclosed are equally applicable in the manufacture of transistors or other semiconductor devices. Furthermore, although a basic etchant preferential as to active impurity concentration is illustrated, it is apparent that the basic concepts of the invention can be applied in conjunction with a basic etchant which is preferential as to conductivity type. That is, it is within the purview of the present invention to utilize a basic etchant which will attack a P type semiconductor region, for example, but will not attack an N type semiconductor region.

What is claimed is:

1. A low junction capacitance semiconductor device comprising: a semiconductor crystal body having first and second contact surfaces at opposite sides thereof, said body defining a first diffused region of one conductivity type extending a predetermined distance inwardly from said first contact surface and a second diffused region of the other conductivity type extending inwardly from said second contact surface to said first region, the boundary between said first and said second regions defining a graded diffused PN junction, said first and said second regions being tapered inwardly from said contact surfaces so that the cross-sectional area of said PN junction is substantially less than the cross-sectional area of each of said contact surfaces; a first ribbon shaped electrical lead element bonded in ohmic contact with the entirety of said first contact surface of said crystal body; and, a second ribbon shaped electrical lead element bonded in ohmic contact with the entirety of said second contact surface of said crystal body.

2. A low junction capacitance semiconductor device comprising: a generally disc shaped semiconductor crystal body having first and second contact surfaces at opposite faces thereof, said body defining a first diffused region of one conductivity type extending a predetermined distance inwardly from said first contact surface and a second diffused region of the other conductivity type extending inwardly from said second contact surface to said first region, the boundary between said first and said second regions defining a diffused PN junction, said first and said second regions being tapered inwardly from said contact surfaces so that the cross-sectional area of said PN junction is substantially less than the cross-sectional area of each of said contact surfaces; a first ribbon shaped electrical lead element bonded in ohmic contact with the entirety of said first contact surface of said crystal body; and, a second ribbon shaped electrical lead element bonded in ohmic contact with the entirety of said second contact surface of said crystal body.

3. A low junction capacitance semiconductor diode comprising: a generally disc shaped silicon crystal body having first and second contact surfaces at opposite faces thereof, said body defining a first diffused region of one conductivity type extending a predetermined distance inwardly from said first contact surface and a second highly doped diffused region of the other conductivity type extending inwardly from said second contact surface to said first region, the boundary between said first and second regions defining a graded PN junction, said first and said second regions being tapered inwardly from said contact surfaces so that the cross-sectional area of said PN junction is substantially less than the cross-sectional area of each of said contact surfaces; a first ribbon shaped electrical lead element bonded in ohmic contact with the entirety of said first contact surface of said crystal body; and, a second ribbon shaped electrical lead element bonded in ohmic contact with the entirety of said second contact surface of said crystal body.

4. In the fabrication of a semiconductor device from a semiconductive crystal body including first and second regions of opposite conductivity types separated by a diffused junction, said second region being heavily doped and extending from said junction to a predetermined planar contact surface of said body, said second region having an exposed surface portion intermediate said junction and said contact surface, said first region having a first planar contact surface opposite said second planar contact surface, the steps of: bonding an electrical contacting element in ohmic contact to substantially the entirety of said planar contact surface; and immersing said body in an etching solution which attacks said exposed portion of said second region but does not significantly attack the semiconductive material of said first region or said electrical contacting element, and maintaining said body within said solution for a time sufficient to reduce the cross-sectional area of said junction a predetermined amount to thereby decrease the junction capacitance.

5. In the fabrication of a semiconductor device from a semiconductive crystal body including first and second regions of opposite conductivity types separated by a diffused junction, said second region being heavily doped and extending from said junction to a predetermined planar contact surface of said body, said second region having an exposed surface portion intermediate said junction and said contact surface, said first region having a first planar contact surface opposite said second planar contact surface, the steps of: bonding first and second electrical contacting elements in ohmic contact to substantially the entirety of said first and second planar contact surfaces; immersing said body in a first etching solution which attacks said exposed portion of said second region but does not significantly attack the semiconductive material of the first region or said electrical contacting elements, said etching solution containing at least 75% by volume of hydrofluoric acid, and maintaining said silicon body within said etching solution a predetermined period of time; immersing said silicon crystal body in a second etching solution of hydrofluoric acid and nitric acid, said hydrofluoric acid being about 50% concentration in water, said nitric acid being about 90% concentration in water, said second etching solution containing approximately 67% by volume of hydrofluoric acid, and maintaining said silicon body within said second etching solution for a predetermined period of time; and transferring said silicon body from said second etching solution into a quench solution without exposure of said silicon body to the ambient, said quench solution containing about 95% by volume of ethanol.

6. In the fabrication of a semiconductor device from a semiconductive crystal body including first and second regions of opposite conductivity types separated by a diffused junction, said second region being heavily doped and extending from said junction to a predetermined planar contact surface of said body, said second region having an exposed surface portion intermediate said junction and said contact surface, said first region having a first planar contact surface opposite said second planar contact surface, the steps of: bonding an electrical contacting element in ohmic contact to substantially the entirety of said second planar contact surface; and immersing said silicon body in an etching solution of hydrofluoric acid and nitric acid, said etching solution containing at least 75% by volume of hydrofluoric acid, and maintaining said silicon crystal body within said etching solution for a time sufficient to reduce the cross-sectional area of said PN junction a predetermined amount to thereby decrease the junction capacitance.

7. In the fabrication of a semiconductor device from a semiconductive crystal body including first and second regions of opposite conductivity types separated by a diffused junction, said second region being heavily doped and extending from said junction to a predetermined planar contact surface of said body, said second region having an exposed surface, said first region having a first planar contact surface opposite said second planar contact surface, the steps of: bonding first and second electrical contacting elements in ohmic contact to substantially the entirety of said first and second planar contact surfaces; immersing said silicon crystal body in a first etching solution of hydrofluoric acid and nitric acid, said etching solution containing at least 75% by volume of hydrofluoric acid, and maintaining said silicon crystal body within said first etching solution a predetermined time; immersing said silicon crystal body in a second etching solution of hydrofluoric acid and nitric acid, said hydrofluoric acid being about 40% concentration in water, said nitric acid being about 90% concentration in water, said second etching solution containing approximately 67% by volume of hydrofluoric acid, and maintaining said silicon body within said second etching solution for a predetermined time; and, transferring said silicon body from said second etching solution into a quench solution without exposure of said silicon body to the ambient, said quench solution containing about 95% by volume of ethanol.

References Cited by the Examiner

UNITED STATES PATENTS

| | | | |
|---|---|---|---|
| 2,786,880 | 3/57 | McKay | 204—143 |
| 2,802,159 | 8/57 | Stump | 317—235 |
| 2,998,558 | 8/61 | Maiden | 317—234 |

FOREIGN PATENTS

| | | |
|---|---|---|
| 849,477 | 9/60 | Great Britain. |

JOHN W. HUCKERT, *Primary Examiner.*

JAMES D. KALLUM, *Examiner.*